(12) United States Patent
Hoya et al.

(10) Patent No.: US 6,816,399 B2
(45) Date of Patent: Nov. 9, 2004

(54) SEMICONDUCTOR MEMORY DEVICE INCLUDING FERROELECTRIC MEMORY FORMED USING FERROELECTRIC CAPACITOR

(75) Inventors: Katsuhiko Hoya, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 10/400,565

(22) Filed: Mar. 28, 2003

(65) Prior Publication Data

US 2003/0185086 A1 Oct. 2, 2003

(30) Foreign Application Priority Data

Mar. 29, 2002 (JP) ........................................ 2002-097887

(51) Int. Cl.⁷ .............................................. G11C 11/22
(52) U.S. Cl. ...................... 365/145; 365/149; 365/182; 257/202
(58) Field of Search ................................ 365/145, 149, 365/182, 212, 104, 139, 185.27, 173–174, 107, 117; 257/202, 206, 208

(56) References Cited

U.S. PATENT DOCUMENTS

| | | | | |
|---|---|---|---|---|
| 5,345,415 A | * | 9/1994 | Nakao et al. | 365/145 |
| 5,943,256 A | * | 8/1999 | Shimizu et al. | 365/145 |
| 6,353,550 B1 | * | 3/2002 | Hirano | 365/145 |
| 6,680,499 B2 | * | 1/2004 | Kumura et al. | 257/295 |

FOREIGN PATENT DOCUMENTS

JP 2002-25247 1/2002

OTHER PUBLICATIONS

D. Takashima, et al., 1997 Symposium on VLSI Circuits Digest of Technical Papers, pp. 83–84, "High–Density Chain Ferroelectric Random–Access Memory (CFRAM)", 1997.

* cited by examiner

Primary Examiner—Richard Elms
Assistant Examiner—Dang T Nguyen
(74) Attorney, Agent, or Firm—Oblon, Spivak, McClelland, Maier & Neustadt, P.C.

(57) ABSTRACT

A semiconductor memory device includes a memory cell block, gate lines and branch lines. The memory cell block includes memory cells connected in series. Each of memory cells has a cell transistor having a source and a drain and a ferroelectric capacitor inbetween the source and the drain. The gate lines are connected to the gates of the cell transistors of the memory cell block. The gate lines have a predetermined width and are arranged at regular intervals. The branch lines are formed of a layer different from that of the gate lines, arranged parallel to the gate lines, and each connected thereto. The branch lines have a predetermined width and are arranged at regular intervals. The sum of the width of the branch lines and the interval between adjacent branch lines differing from the sum of the width of the gate lines and the interval between adjacent gate lines.

28 Claims, 5 Drawing Sheets

SEMICONDUCTOR MEMORY DEVICE INCLUDING FERROELECTRIC MEMORY FORMED USING FERROELECTRIC CAPACITOR

CROSS-REFERENCE TO RELATED APPLICATIONS

This application is based upon and claims the benefit of priority from the prior Japanese Patent Application No. 2002-097887, filed Mar. 29, 2002, the entire contents of which are incorporated herein by reference.

BACKGROUND OF THE INVENTION

1. Field of the Invention

The present invention relates to a semiconductor memory device, and more particularly to a ferroelectric memory using a ferroelectric capacitor.

2. Description of the Related Art

Semiconductor memories are now being used everywhere such as for the main storages of large-sized computers, personal computers, household electrical appliances, portable telephones, etc. Semiconductor memories on the market include volatile DRAMs (Dynamic RAMs) and SRAMs (Static RAMs), and nonvolatile MROMs (Mask ROMs), Flash EEPROMs and ferroelectric memories, etc.

Ferroelectric memories utilize a hysteresis characteristic that is one of the characteristics of a ferroelectric, i.e., utilizes the difference between the two residual polarization amounts of each ferroelectric capacitor, thereby storing binary data in a nonvolatile state. In general, each of the memory cells that provide a conventional ferroelectric memory is formed by connecting a capacitor (ferroelectric capacitor) to a transistor in series, as in a DRAM.

However, unlike DRAMs, it is necessary in ferroelectric memories to drive a plate line in order to read a signal charge to a bit line, since data is stored using a residual polarization amount difference. To this end, ferroelectric memories require a plate line driving circuit for driving a plate line. Further, since conventional ferroelectric memories have the same structure as DRAMs, plate line driving circuits are provided for respective plate lines. Accordingly, the plate line driving circuits occupy a large part of a memory circuit forming area.

On the other hand, a cell array method for use in ferroelectric memories has been proposed which can reduce the area required for the plate line driving circuits (D. Takashima et al., "High-density chain Ferroelectric random memory (CFeRAM)" in proc. VLSI Symp. June 1997, pp 83–84). In this case, the source and drain of a cell transistor (T) are connected to the opposite ends of a ferroelectric capacitor (C), thereby forming a unit cell (memory cell) MC. A plurality of such unit cells are connected in series, thereby forming a memory cell block. The thus-constructed ferroelectric memory will hereinafter be referred to as a "series connected TC unit type ferroelectric memory".

In the series connected TC unit type ferroelectric memory, eight unit cells, for example, can commonly use one plate line driving circuit. Therefore, the memory cell array formed of a plurality of memory cell blocks can be highly integrated.

FIG. 1A is a circuit diagram illustrating a memory cell array employed in the series connected TC unit type ferroelectric memory. FIG. 1B is a plan view illustrating the layout of the memory cell array.

Each unit cell MC is formed of the cell transistor T and ferroelectric capacitor C connected in parallel. In the case of FIG. 1A, eight unit cells MC are connected in series, thereby forming a memory cell block MCB0 (or MCB1). The memory cell blocks MCB0 and MCB1 are connected to a pair of bit lines BL and /BL, respectively.

One end of the memory cell block MCB0 is connected to the bit line BL via a block selection transistor BST0, and the other end is connected to a plate line PL. Similarly, one end of the memory cell block MCB0 is connected to the bit line /BL via a block selection transistor BST1, and the other end is connected to a plate line /PL.

Word lines WL0–WL7 are connected to the respective gates of the cell transistors of each of the memory cell blocks MCB0 and MCB1. Block selection signal lines BS0 and BS1 are connected to the gates of the block selection transistors BST0 and BST1, respectively.

As seen from FIG. 1B, the plate lines PL and /PL, word lines WL0–WL7, and block selection signal lines BS0 and BS1 extend perpendicular to the cell arrangement of the memory cell blocks MCB0 and MCB1. Accordingly, the memory cell blocks MCB0 and MCB1 can commonly use the lines.

As described above, in the series connected TC unit type ferroelectric memory shown in FIG. 1A, a plurality of memory cell blocks commonly use the plate lines PL and /PL, word lines WL0–WL7, block selection signal lines BS0 and BS1, and control circuits for the respective signals. The chip size of the ferroelectric memory can be reduced by increasing the number of memory cell blocks connected to the plate lines PL and /PL, word lines WL0–WL7 and block selection signal lines BS0 and BS1. However, the larger the number of memory cell blocks commonly connected to those lines, the greater the signal delay in the lines.

To solve this problem, a method is employed, in which a branch line is formed of a layer different from that of a trunk line having a large delay or a large amount of current flown therethrough, and is arranged parallel thereto such that the lines are connected to each other at regular intervals.

A description will now be given of a series connected TC unit type ferroelectric memory having such trunk and branch lines as the above.

FIG. 2A is a circuit diagram illustrating a memory cell array employed in a conventional series connected TC unit type ferroelectric memory. FIG. 1B is a sectional view illustrating a memory cell array in which a branch line is formed by a conventional method.

The sectional view schematically illustrates source/drain diffusion layers 101, gate lines 102, a plate line 103, contact plugs 104, and branch lines 105 for the gate lines 102. The plate line 103 and branch lines 105 are formed of a single layer. The gate lines 102 correspond to the word lines WL0–WL7 and block selection signal lines BS0 and BS1 shown in FIG. 1A. The sectional structure of each ferroelectric capacitor is not shown.

In the prior art, the branch lines 105 for the gate lines 102 are formed of a line layer provided on the gate line layer 102, as is shown in FIG. 2B. In this method, to enable the gate lines 102 to be connected to the branch lines 105 by contact plugs, the pitch (line width+line interval) of the branch lines 105 needs to be made identical to the pitch of the gate lines 102. In other words, the line width of the branch lines 105 cannot be changed in accordance with a current flowing through the gate lines 102.

Furthermore, if the line width of the plate line 103 formed of the same layer as the branch lines 105 is increased to avoid problems involving a signal delay in line or electronic migration due to resistors and capacitors, the memory block size is inevitably increased.

BRIEF SUMMARY OF THE INVENTION

According to an aspect of the invention, there is provided a semiconductor memory device comprising: a memory cell block which includes series connected memory cells each having a cell transistor having a source and a drain and a ferroelectric capacitor inbetween the source and the drain; a plurality of gate lines connected to gates of the cell transistors of the memory cell block, the gate lines having a predetermined width and being arranged at regular intervals; and a plurality of branch lines formed of a layer different from a layer of the gate lines, arranged parallel to the gate lines, and each connected to a corresponding one of the gate lines, the branch lines having a predetermined width and being arranged at regular intervals, a sum of the predetermined width of the branch lines and an interval between adjacent ones of the branch lines differing from a sum of the predetermined width of the gate lines and an interval between adjacent ones of the gate lines.

DETAILED DESCRIPTION OF THE INVENTION

Figure 1A:
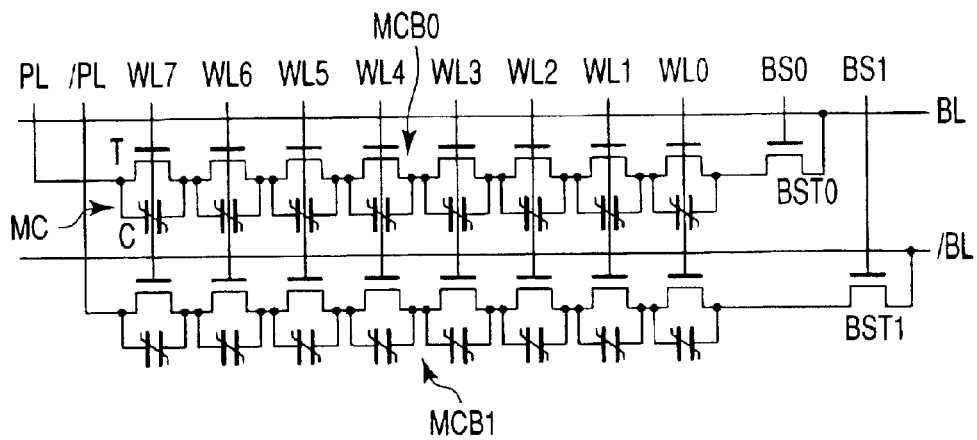
FIG. 1A is a circuit diagram illustrating memory cell blocks employed in a conventional series connected TC unit type ferroelectric memory.
Figure 1B:
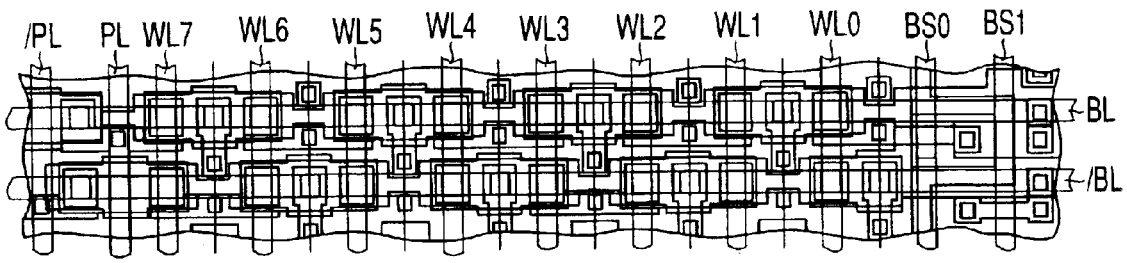
FIG. 1B is a plan view illustrating the layout of the memory cell blocks.
Figure 2A:
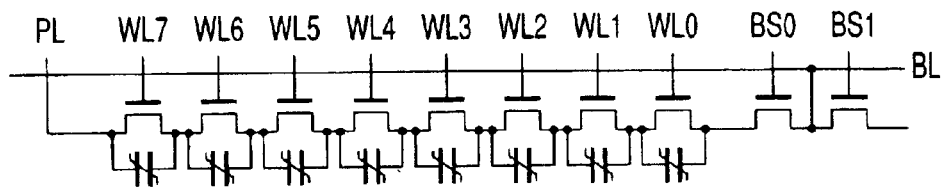
FIG. 2A is a circuit diagram illustrating a memory cell block employed in another conventional series connected TC unit type ferroelectric memory.
Figure 2B:
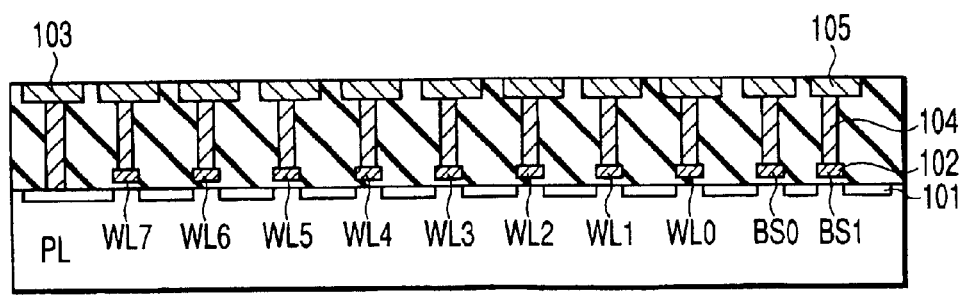
FIG. 2B is a sectional view illustrating the memory cell block in which branch lines are formed by a conventional method.

Reference will now be made in detail to ferroelectric memories as semiconductor memories according to embodiments of the invention, as illustrated in the accompanying drawings, in which like reference characters designate like or corresponding parts throughout the several drawings.

First Embodiment

Firstly, a series connected TC unit type ferroelectric memory according to a first embodiment of the invention will be described. In this series connected TC unit type ferroelectric memory, the source and drain of a cell transistor (T) are connected to the opposite ends of a ferroelectric capacitor (C) to form a unit cell (memory cell), and a plurality of such unit cells are connected in series to form a memory cell block.

Figure 3:
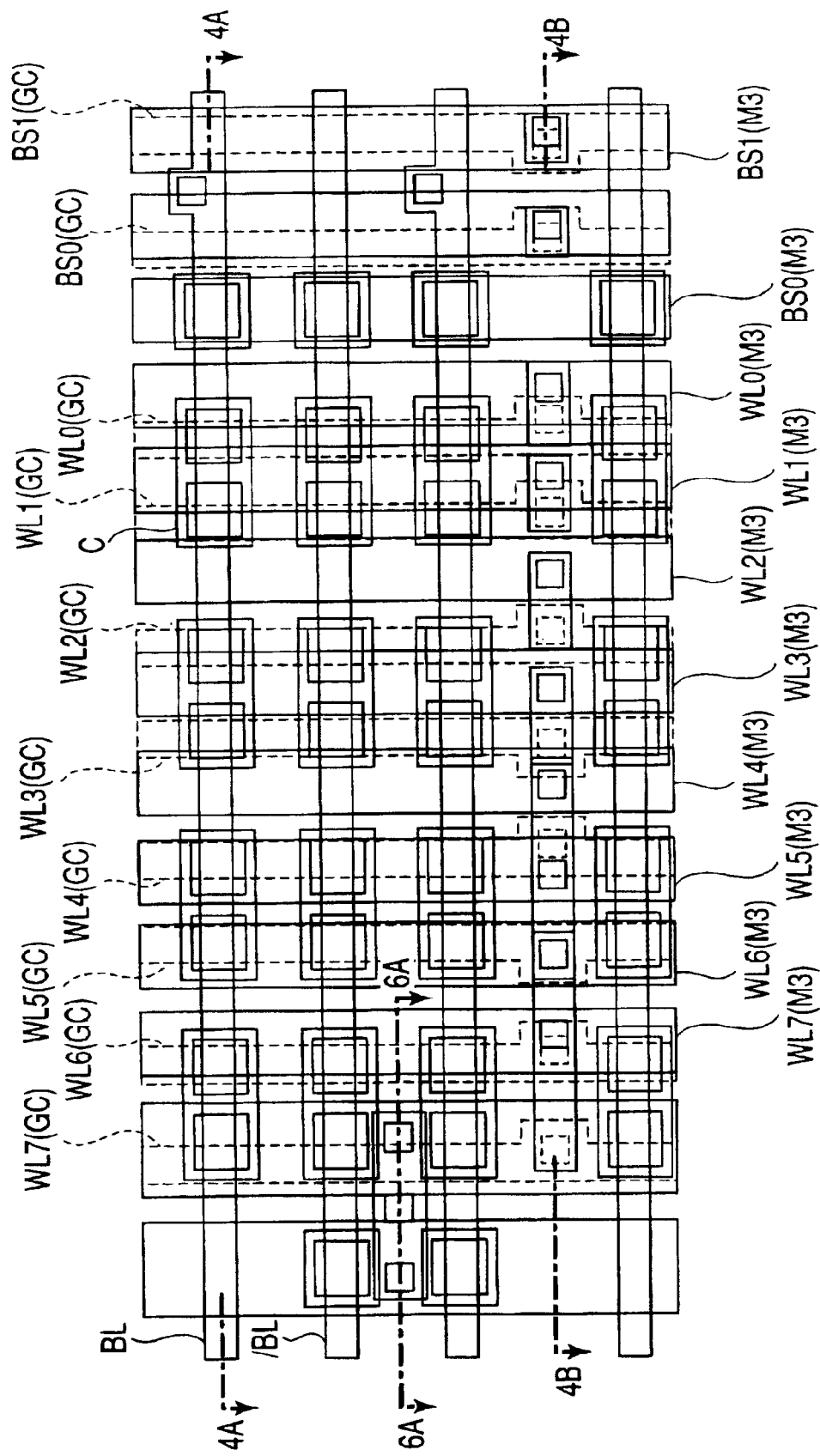
FIG. 3 is a plan view illustrating the layout of memory cell blocks employed in a series connected TC unit type ferroelectric memory according to a first embodiment of the invention.

FIG. 3 is a plan view illustrating the layout of memory cell blocks employed in the series connected TC unit type ferroelectric memory according to the first embodiment of the invention. In this case, eight unit cells are connected in series, and the cell transistor of each unit cell is connected to word lines (gate lines) WL0–WL7.

As seen from FIG. 3, in each memory block, the word lines WL0 (GC)–WL7 (GC) formed on a gate insulation film are arranged in this order from the right. Block selection signal lines BS0(GC) and BS1(GC), which are the gate lines of block selection transistors, are provided at the right side of the word line WL0.

Branch lines WL0(M3)–WL7(M3) and BS0(M3) and BS1(M3), which are composed of lines M3 that are made of a third layer, are provided on the word lines WL0(GC)–WL7 (GC) and block selection signal lines BS0(GC) and BS1 (GC). A plate line PL(M3) is provided at the left side of the branch line WL7(M3). Further, bit lines BL and/BL are provided in a direction perpendicular to the direction of the word lines WL0(GC)–WL7 (GC). A ferroelectric capacitor C is formed between each of the word lines WL0(GC)–WL7 (GC) and a corresponding one of the branch lines WL0(M3)–WL7(M3).

A description will be given of the sectional structure of each memory block.

Figure 4A:
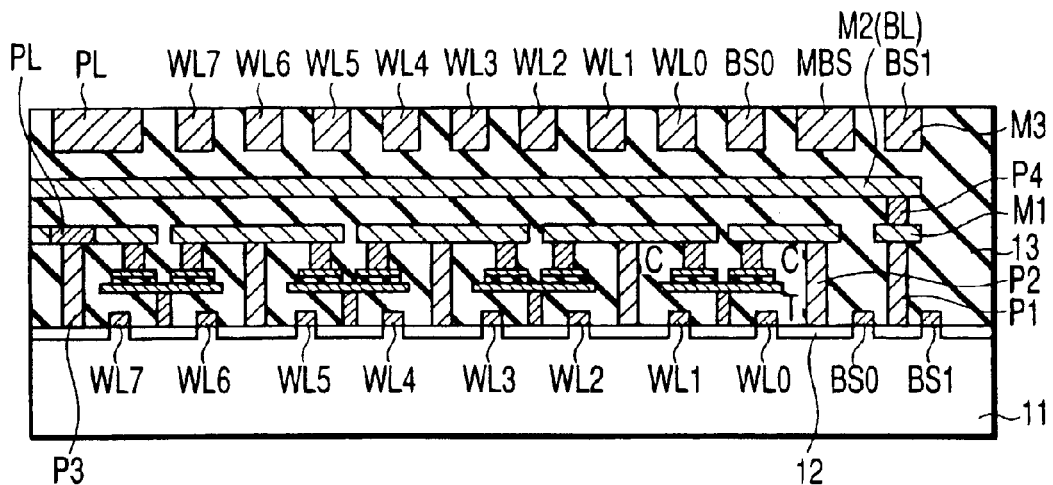
FIG. 4A is a sectional view taken along line 4A—4A in FIG. 3.

FIG. 4A is a sectional view taken along line 4A—4A in FIG. 3.

As shown in FIG. 4A, a plurality of source/drain regions 12 are formed in the surface of a semiconductor substrate 11. The word lines (gate lines) WL0–WL7 of cell transistors and the block selection signal lines BS0 and BS1 of block selection transistors are formed on the substrate 11 via a gate insulation film (not shown) between each pair of adjacent source/drain regions 12.

Lines M1 formed of a first layer that is made of, for example, a metal are provided on the word lines WL0–WL7 and block selection signal lines BS0 and BS1, with an interlayer insulation film 13 interposed therebetween. A ferroelectric capacitor C is formed between each line M1 and a corresponding source/drain region 12. A plate line PL formed of a line M1 of the first layer is provided at the left side of the word line WL7.

A contact plug P1 is formed between the source/drain region 12 of a block selection transistor and a corresponding line M1. A contact plug P2 is formed between the source/drain region 12 of each cell transistor and a corresponding line M1. Further, a contact plug P3 is formed between the source/drain region 12 of the leftmost cell transistor and a plate line PL (line M1).

Furthermore, a line M2 formed of a second layer that is made of, for example, a metal is provided above the lines M1. The line M2 serves as a bit line BL and is connected, via a contact plug P4, the line M1 that is connected to the source/drain region 12 of the block selection transistor. Yet further, lines M3 formed of a third layer that is made of, for example, a metal are provided above the line M2. The lines M3 are connected to the block selection signal line BS1, signal line MBS, block selection signal line BS0, word lines WL0–WL7 and plate line PL in this order from the right, and serve as branch lines. The signal line MBS is connected to a control circuit (not shown) for controlling the block selection transistors, and is interposed between the block selection signal lines BS0 and BS1.

Figure 4B:
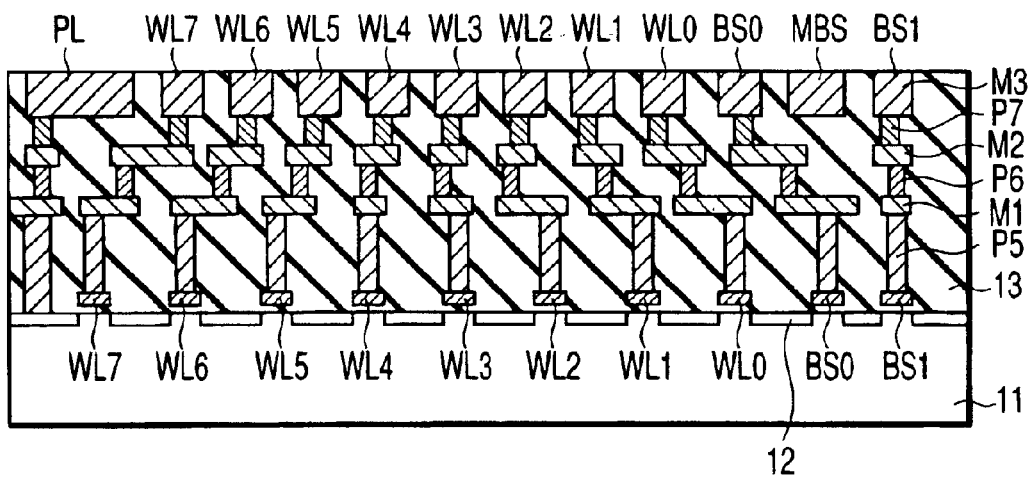
FIG. 4B is a sectional view taken along line 4B—4B in FIG. 3.

FIG. 4B is a sectional view taken along line 4B—4B in FIG. 3. FIG. 4B shows the three lines M1, M2 and M3 and contact plugs formed of layers that differ from the layers of the gate lines (word lines WL0–WL7 and block selection signal lines BS0 and BS1).

As seen from FIG. 4B, a plurality of source/drain regions 12 are formed in the surface of the semiconductor substrate 11 as described above. The word lines WL0–WL7 of the cell transistors, and the block selection signal lines BS0 and BS1 of the block selection transistors are formed on the substrate 11 via the aforementioned gate insulation film between each pair of adjacent source/drain regions 12. The word lines WL0–WL7 are arranged with substantially the same pitch (first pitch).

The lines M1, M2 and M3 are provided, in this order from the bottom, on the word lines WL0–WL7 and block selection signal lines BS0 and BS1 via the interlayer insulation film 13.

Contact plugs P5 are provided between the word lines WL0–WL7 and block selection signal lines BS0 and BS1, and the lines M1, thereby connecting them. The contact plugs P5 are arranged with substantially the aforementioned first pitch so that they can be aligned with the word lines WL0–WL7 and block selection signal lines BS0 and BS1.

Contact plugs P6 are provided between the lines M1 and M2, thereby connecting them. The contact plugs P6, which are connected to the word lines WL3 and WL4 located at a central portion of the memory cell block, are located just above the word lines WL3 and WL4.

The contact plug P6 located at the right side of the word line WL3 is located at a shorter distance from the plug P6 located just above the word line WL3 than the aforementioned first pitch. Similarly, the contact plug P6 located at the left side of the word line WL4 is located at a shorter distance from the plug P6 located just above the word line WL4 than the first pitch.

Contact plugs P7 are provided between the lines M2 and M3, thereby connecting them. The contact plugs P7, which are connected to the word lines WL3 and WL4 located at a central portion of the memory cell block, are located just above the word lines WL3 and WL4. The contact plugs P7 that are not connected to the word line WL3 or WL4 are arranged with a narrower pitch than the first pitch, so that they can be located closer to the plugs P7 connected to the word lines WL3 and WL4. As a result, the lines M3 connected to the plugs P7 are arranged with a second pitch narrower than the first pitch. The lines M3 are connected to the block selection signal line BS1, signal line MBS, block selection signal line BS0, word lines WL0–WL7 and plate line PL, in this order from the right.

By virtue of the above-described structure, branch lines arranged with a narrower pitch than that of the word lines (gate lines) WL0–WL7 can be realized using the lines M3.

In the first embodiment, the lines M3 formed of the uppermost layer extend parallel to the gate lines, and perpendicular to the line of each memory cell block. Further, the lines M3 are connected to the gate lines, as shown in FIG. 4B, between each pair of adjacent memory cell blocks. The lines M1 and M2 located between the gate lines and uppermost lines M3 are used as relay lines for connecting the lines M3 to the gate lines as shown in FIG. 4B. This structure enables the pitch (line width+line interval) of the lines M3 to be made different from that of the gate lines. In the embodiment, the pitch of the lines M3 is made narrower than that of the gate lines. Thus, the width of the branch lines M3 can be set with a higher degree of freedom. This enables a space to be secured for forming other lines.

Further, as shown in FIG. 4B, the signal line MBS connected to a control circuit (not shown) for controlling the block selection transistors can be located between the block selection signal lines BS0 and BS1 by making the pitch of the lines M3 narrower than that of the gate lines.

Figure 5A:
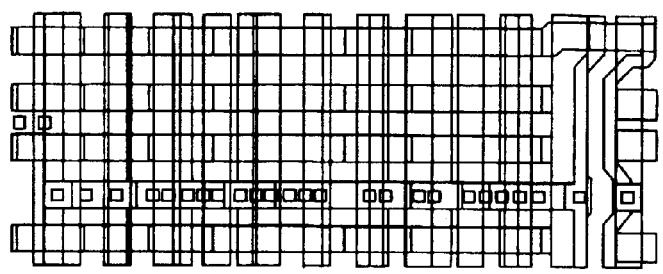
FIG. 5A is a plan view illustrating a part of the layout of the memory cell blocks shown in FIG. 3.
Figure 5B:
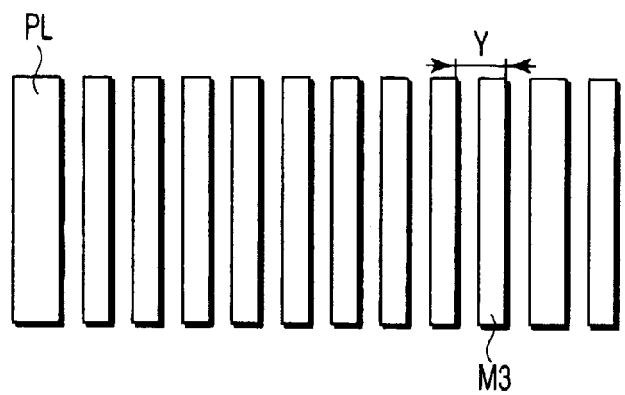
FIG. 5B is a plan view illustrating third lines M3 employed in the memory blocks.
Figure 5C:
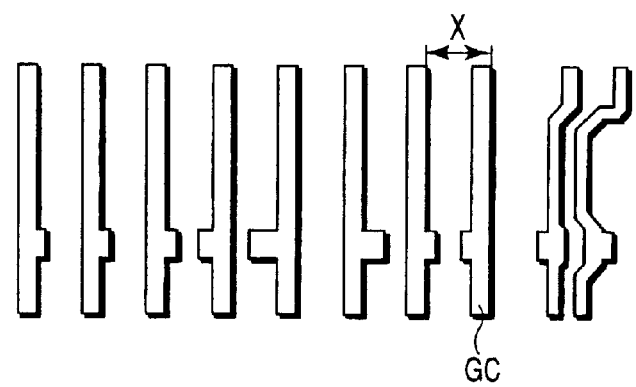
FIG. 5C is a plan view illustrating the gate lines (word lines, block selection signal lines) of the memory cell blocks.

FIG. 5A is a plan view illustrating a part of the layout of the memory cell blocks shown in FIG. 3. FIG. 5B is a plan view illustrating the third lines M3 employed in the memory blocks. FIG. 5C is a plan view illustrating the gate lines (word lines, block selection signal lines) of the memory cell blocks.

From these figures, it is understood that the pitch Y of the lines M3 is narrower than the pitch X of the gate lines GC. Further, as shown in FIG. 5B, the plate line PL as one of the lines M3 can be made thick by making the pitch Y of the branch lines M3 for the gate lines GC narrower than the pitch X of the gate lines GC.

A description will now be given of the sectional structure of a portion between adjacent memory cell blocks in the ferroelectric memory.

Figure 6A:
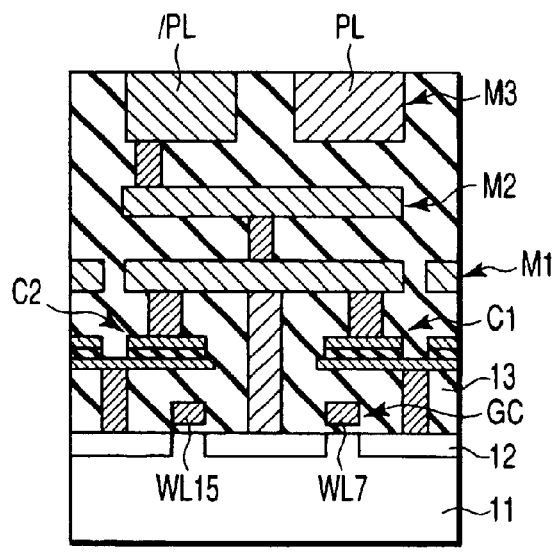
FIG. 6A is a sectional view taken along line 6A—6A in FIG. 3.

FIG. 6A is a sectional view taken along line 6A—6A in FIG. 3, illustrating the cross section of a portion between adjacent memory cell blocks.

As seen from FIG. 6A, the source/drain regions 12 are formed in the surface of the semiconductor substrate 11. Each of the word lines WL7 and WL15 is formed on the substrate via a gate insulation film (not shown) between adjacent source/drain regions 12. The word line WL7 is dedicated to one of a pair of memory cell blocks, and the other word line WL 15 to the other memory cell block.

Ferroelectric capacitors C1 and C2 are formed on the word lines WL7 and WL15, respectively, via the interlayer insulation film 13. The lines M1, M2 and M3 are formed, in this order from the bottom, on the capacitors C1 and C2 via the interlayer insulation film 13. The plate lines PL and /PL are composed of two of the lines M3 that are made of the third layer.

Figure 6B:
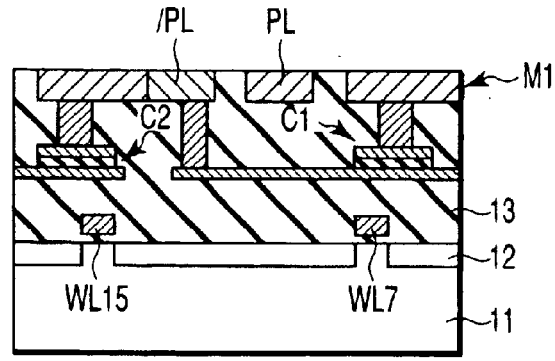
FIG. 6B is a sectional view illustrating the structure between memory cell blocks obtained when the plate lines are composed of lines M1 that are made of a first layer.

FIG. 6B is a sectional view illustrating the structure between adjacent memory cell blocks obtained when the plate lines are composed of two of the lines M1 that are made of the first layer. As shown, when the plate lines PL are composed of the two lines M1, they are located between the other two lines M1 connected to the ferroelectric capacitors C1 and C2, and hence the distance between the adjacent capacitors C1 and C2 is longer than in the structure shown in FIG. 6A.

As is understood from FIGS. 6A and 6B, if the plate lines PL are composed of two of the lines M3 and located on the corresponding cell transistors, the distance between the adjacent memory cell blocks can be reduced without thinning the width of the plate lines. As a result, the memory cell array in which a plurality of memory cell blocks are arranged can be made compact.

As described above, in the first embodiment, the amount of current flowing through the gate lines and/or the width of the branch lines M3 can be adjusted, so as to compensate a signal delay in the gate lines, by making the pitch of the branch lines M3 different from that of the gate lines. In addition, lines other than the branch lines can be provided in the same wiring layer as the branch lines, i.e., without increasing the number of wiring layers.

Second Embodiment

A series connected TC unit type ferroelectric memory according to a second embodiment of the invention will be described. In the first embodiment, when the branch lines are composed of lines M3, they are arranged centered on the central word lines WL3 and WL4. On the other hand, in the second embodiment, branch lines formed of lines M3 are arranged centered on the rightmost word line WL0.

Figure 7:
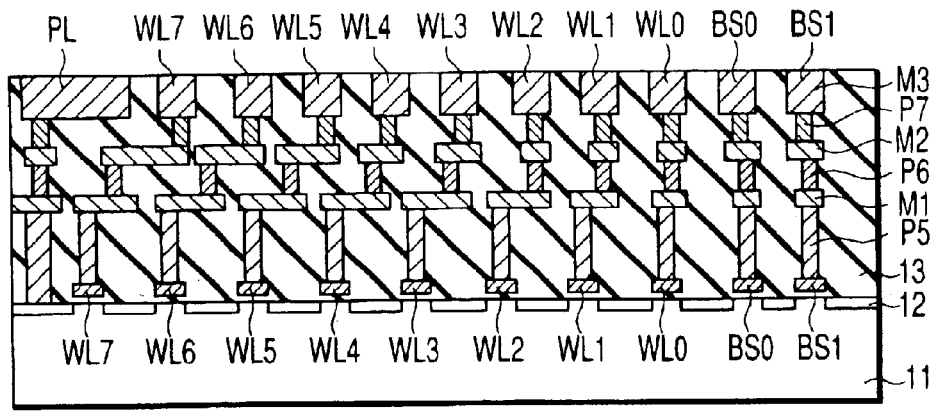
FIG. 7 is a sectional view illustrating memory cell blocks employed in a series connected TC unit type ferroelectric memory according to a second embodiment of the invention.

FIG. 7 is a sectional view illustrating memory cell blocks employed in the series connected TC unit type ferroelectric memory of the second embodiment of the invention. It shows a cross section taken along line 4A—4A in FIG. 3.

As seen from FIG. 7, a plurality of source/drain regions 12 are formed in the surface of the semiconductor substrate 11, as in the first embodiment. Between the adjacent source/drain regions 12, the word lines (gate lines) WL0–WL7 of cell transistors, and the block selection signal lines (gate lines) BS0 and BS1 of block selection transistors are formed on the substrate 11 with a gate insulation film (not shown) interposed therebetween. The word lines WL0–WL7 are arranged with substantially the same pitch (first pitch).

Lines M1, M2 and M3 are provided, in this order from the bottom, on the word lines WL0–WL7 and block selection signal lines BS0 and BS1 via the interlayer insulation film 13.

Contact plugs P5 are provided between the word lines WL0–WL7 and block selection signal lines BS0 and BS1, and the lines M1, thereby connecting them. The contact plugs P5 are arranged with substantially the aforementioned first pitch so that they can be aligned with the word lines WL0–WL7 and block selection signal lines BS0 and BS1.

Contact plugs P6 are provided between the lines M1 and M2, thereby connecting them. The contact plug P6, which is connected to the rightmost word line WL0, is located just above the word line WL0. The other contact plugs P6 are arranged with a narrower pitch than the first pitch so that they can be located closer to the word line WL0.

Contact plugs P7 are provided between the lines M2 and M3, thereby connecting them. The contact plug P7, which is connected to the rightmost word line WL0, is located just above the word line WL0. The other contact plugs P7 are arranged with a narrower pitch than the first pitch so that they can be located closer to the word line WL0. Thus, the lines M3 are arranged with a second pitch narrower than the first pitch of the word lines WL0–WL7. The lines M3 are connected to the block selection signal lines BS1 and BS0, word lines WL0–WL7 and plate line PL, in this order from the right.

By virtue of the above-described structure, branch lines arranged with a narrower pitch than that of the word lines (gate lines) WL0–WL7 can be realized using the lines M3. In this case, the width of the plat line PL can be thickened by changing the pitch of the lines M3.

In the second embodiment, the lines M3 formed of the uppermost layer extend parallel to the gate lines. Further, as shown in FIG. 7A, the gate lines are connected to the lines M3 via the lines M1 and M2 and contact plugs. This structure enables the pitch (line width+line interval) of the lines M3 to be made different from that of the gate lines. In the embodiment, the pitch of the lines M3 is made narrower than that of the gate lines. Thus, the width of the branch lines M3 can be set with a higher degree of freedom. This enables a space to be secured for forming other lines.

Figure 8:
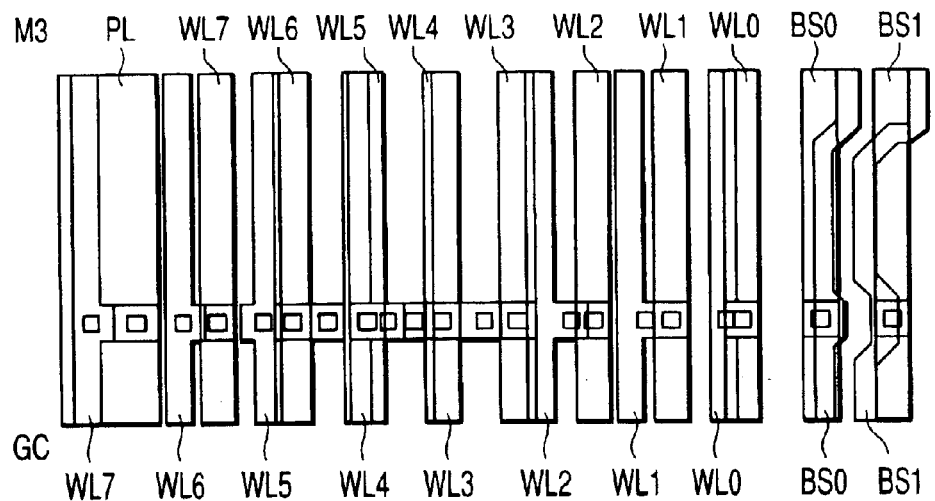
FIG. 8 is a plan view illustrating the layout of the memory cell blocks employed in the ferroelectric memory of the second embodiment.

FIG. 8 is a plan view illustrating the layout of memory cell blocks employed in the ferroelectric memory of the second embodiment.

As shown in FIG. 8, the block selection signal lines BS1 and BS0, and word lines WL0–WL7, which are gate lines, are arranged in this order from the right. Further, the block selection signal lines BS1 and BS0, word lines WL0–WL7 and plate line PL, which are formed of the lines M3, are arranged in this order from the right.

It is understood from FIG. 8 that the pitch of the lines M3 is narrower than that of the gate lines. Further, the plate line PL as one of the lines M3 can be made thick by making the pitch of the branch lines narrower than that of the gate lines.

As described above, in the second embodiment, the amount of current flowing through the gate lines and/or the width of the branch lines M3 can be adjusted, so as to compensate a signal delay in the gate lines, by making the pitch of the branch lines M3 different from that of the gate lines. In addition, lines other than the branch lines can be provided in the same wiring layer as the branch lines, i.e., without increasing the number of wiring layers.

Third Embodiment

A series connected TC unit type ferroelectric memory according to a third embodiment of the invention will be described. In the first embodiment, the branch lines are formed of the lines M3 of the third layer, while in the third embodiment, the branch lines are formed of lines M2 made of the second layer.

Figure 9:
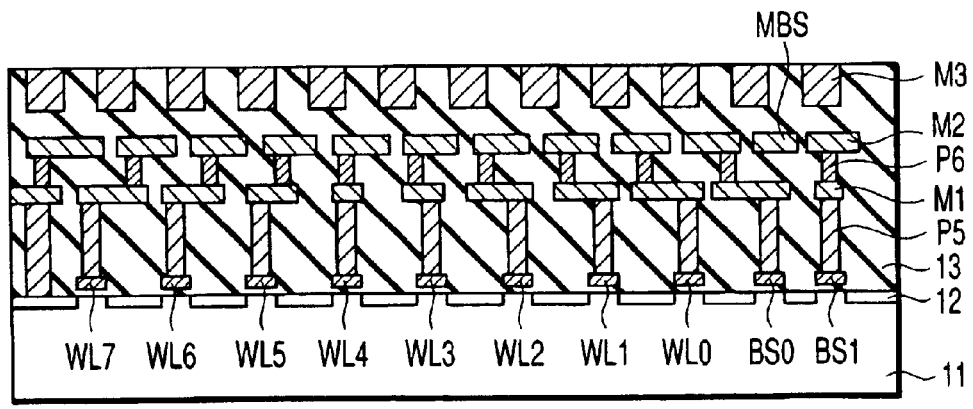
FIG. 9 is a sectional view illustrating memory cell blocks employed in a series connected TC unit type ferroelectric memory according to a third embodiment of the invention.

FIG. 9 is a sectional view illustrating memory cell blocks employed in the series connected TC unit type ferroelectric memory according to the third embodiment. It shows a cross section taken along line 4A—4A in FIG. 3.

In the first embodiment, the branch lines are formed by connecting the gate lines to the uppermost lines M3 between the different types of lines M1, M2 and M3. On the other hand, in the third embodiment, the branch lines are formed by connecting the intermediate lines M2 provided below the uppermost lines M3.

As seen from FIG. 9, a plurality of source/drain regions 12 are formed in the surface of the semiconductor substrate 11, as in the first or second embodiment. Between the adjacent source/drain regions 12, the word lines WL0–WL7 of cell transistors, and the block selection signal lines BS0 and BS1 of block selection transistors are formed on the substrate 11 with a gate insulation film (not shown) interposed therebetween. The word lines WL0–WL7 are arranged with substantially the same pitch (first pitch).

The lines M1, M2 and M3 are provided, in this order from the bottom, on the word lines WL0–WL7 and block selection signal lines BS0 and BS1 via the interlayer insulation film 13.

Contact plugs P5 are provided between the word lines WL0–WL7 and block selection signal lines BS0 and BS1, and the lines M1, thereby connecting them. The contact plugs P5 are arranged with substantially the aforementioned first pitch so that they can be aligned with the word lines WL0–WL7 and block selection signal lines BS0 and BS1.

Contact plugs P6 are provided between the lines M1 and M2, thereby connecting them. The contact plug P6, which is connected to the word line WL4 located at a central portion of the memory cell block, is located just above the word line WL4.

The contact plugs P6 located at the right side of the word line WL4 are arranged with a narrower pitch than the first pitch, so that they can be located closer to the plug P6 located just above the word line WL4. Similarly, the contact plugs P6 located at the left side of the word line WL4 are arranged with a narrower pitch than the first pitch, so that they can be located closer to the plug P6 located just above the word line WL4. Further, the lines M2 connected to the contact plugs P6 are arranged with a narrower pitch than the first pitch of the word lines WL0–WL7, as is shown in FIG. 9.

By virtue of the above-described structure, branch lines arranged with a narrower pitch than that of the word lines (gate lines) WL0–WL7 can be realized using the lines M2.

In the third embodiment, the lines M2 formed of the second layer extend parallel to the gate lines and perpendicular to the line of each memory cell block. Further, the lines M2 are connected to the gate lines, as shown in FIG. 9, between each pair of adjacent memory cell blocks. The lines M1 located between the gate lines and lines M2 are used as relay lines for connecting the lines M2 to the gate lines. This structure enables the pitch (line width+line interval) of the lines M2 to be made different from that of the gate lines. In the embodiment, the pitch of the lines M2 is made narrower than that of the gate lines. Thus, the width of the branch lines M2 can be set with a higher degree of freedom. This enables a space to be secured for forming other lines.

Further, the signal line MBS connected to a control circuit (not shown) for controlling the block selection transistors can be located between the block selection signal lines BS0 and BS1 by changing the pitch of the lines M2.

As described above, in the third embodiment, the amount of current flowing through the gate lines and/or the width of the branch lines M2 can be adjusted, so as to compensate a signal delay in the gate lines, by making the pitch of the branch lines M2 different from that of the gate lines. In addition, lines other than the branch lines can be provided in the same wiring layer as the branch lines, i.e., without increasing the number of wiring layers.

Further, the above-described embodiments can be carried out, individually or in combination.

In addition, the above-described embodiments contain inventions of various stages, and these inventions can be extracted by appropriately combining the structural elements employed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell block which includes series connected memory cells each having a cell transistor having a source and a drain and a ferroelectric capacitor inbetween the source and the drain;
   a plurality of gate lines connected to gates of the cell transistors of the memory cell block, the gate lines having a width and being arranged at intervals; and
   a plurality of branch lines formed of a layer different from a layer of the gate lines, arranged parallel to the gate lines, and each connected to a corresponding one of the gate lines, the branch lines having a width and being arranged at intervals, a sum of the width of the branch lines and an interval between each pair of adjacent ones of the branch lines differing from a sum of the width of the gate lines and an interval between each pair of adjacent ones of the gate lines.

2. The semiconductor memory device according to claim 1, further comprising a plate line formed of a layer different from the layer of the gate lines, the plate line being connected to an end of the memory cell block.

3. The semiconductor memory device according to claim 2, wherein the plate line has a width extending to the gate lines.

4. The semiconductor memory device according to claim 2, wherein the plate line has a width wider than a width of the branch lines.

5. The semiconductor memory device according to claim 1, wherein the layer forming the branch lines is included in a plurality of wire layers formed on the gate lines via an insulation film.

6. The semiconductor memory device according to claim 1, wherein the layer forming the branch lines is included in a plurality of wire layers formed above the gate lines via an insulation film, at least one wire layer being interposed between the plurality of wire layers and the gate lines, the layer forming the branch lines being connected to the gate lines at regular intervals.

7. The semiconductor memory device according to claim 1, wherein the layer forming the branch lines is formed of an uppermost one of a plurality of wire layers provided on the gate lines via an insulation film, the layer forming the branch lines being connected to the gate lines at regular intervals.

8. The semiconductor memory device according to claim 1, wherein the sum of the width of the branch lines and the interval between said each pair of the adjacent ones of the branch lines is smaller than the sum of the width of the gate lines and the interval between said each pair of the adjacent ones of the gate lines.

9. The semiconductor memory device according to claim 1, wherein the branch lines are arranged such that they are located close to a center of the memory cell block.

10. The semiconductor memory device according to claim 1, wherein the branch lines are arranged such that they are located on one side of the memory cell block.

11. The semiconductor memory device according to claim 1, wherein the predetermined width of the branch lines is wider than the predetermined width of the gate lines.

12. The semiconductor memory device according to claim 11, wherein the sum of the width of the branch lines and the interval between said each pair of the adjacent ones of the branch lines is smaller than the sum of the width of the gate lines and the interval between said each pair of the adjacent ones of the gate lines.

13. The semiconductor memory device according to claim 1, wherein the gate lines have a regular width, and are arranged parallel to each other at regular intervals.

14. A semiconductor memory device comprising:
   a memory cell block which includes series connected memory cells each having a cell transistor having a source and a drain and a ferroelectric capacitor inbetween the source and the drain;
   a selective transistor having an end of a current path thereof connected to one end of the memory cell block;
   a bit line connected to another end of the current path of the selective transistor;
   a plate line connected to another end of the memory cell block;
   a plurality of gate lines connected to gates of the cell transistors of the memory cell block, the gate lines having a predetermined width and being arranged at regular intervals; and a plurality of branch lines formed of a layer different from a layer of the gate lines, arranged parallel to the gate lines, and each connected to a corresponding one of the gate lines, the branch lines having a predetermined width and being arranged at regular intervals, a sum of the predetermined width of the branch lines and an interval between each pair of adjacent ones of the branch lines differing from a sum of the predetermined width of the gate lines and an interval between each pair of adjacent ones of the gate lines.

15. The semiconductor memory device according to claim 14, wherein the plate line is formed of a layer different from the layer of the gate lines, the plate line being arranged parallel to the gate lines.

16. The semiconductor memory device according to claim 15, wherein the plate line has a width extending to the gate lines.

17. The semiconductor memory device according to claim 14, wherein the plate line has a width wider than a width of the branch lines.

18. The semiconductor memory device according to claim 14, wherein the layer forming the branch lines is included in a plurality of wire layers formed on the gate lines via an insulation film.

19. The semiconductor memory device according to claim 14, wherein the layer forming the branch lines is included in a plurality of wire layers formed above the gate lines via an insulation film, at least one wire layer being interposed between the plurality of wire layers and the gate lines, the layer forming the branch lines being connected to the gate lines at regular intervals.

20. The semiconductor memory device according to claim 14, wherein the layer forming the branch lines is formed of an uppermost one of a plurality of wire layers provided on the gate lines via an insulation film, the layer forming the branch lines being connected to the gate lines at regular intervals.

21. The semiconductor memory device according to claim 14, wherein the sum of the predetermined width of the branch lines and the interval between said each pair of the adjacent ones of the branch lines is smaller than the sum of the predetermined width of the gate lines and the interval between said each pair of the adjacent ones of the gate lines.

22. The semiconductor memory device according to claim 14, wherein the branch lines are arranged such that they are located close to a center of the memory cell block.

23. The semiconductor memory device according to claim 14, wherein the branch lines are arranged such that they are located on one side of the memory cell block.

24. The semiconductor memory device according to claim 14, wherein the predetermined width of the branch lines is wider than the predetermined width of the gate lines.

25. The semiconductor memory device according to claim 24, wherein the sum of the predetermined width of the branch lines and the interval between said each pair of the adjacent ones of the branch lines is smaller than the sum of the predetermined width of the gate lines and the interval between said each pair of the adjacent ones of the gate lines.

26. The semiconductor memory device according to claim 14, wherein the gate lines have a regular width, and are arranged parallel to each other at regular intervals.

27. A semiconductor memory device comprising:

a memory cell array including a plurality of memory cell blocks, each of the memory cell blocks including at least one memory cell group, the at least one memory cell group having an end connected to a bit line via a selective transistor, and another end connected to a plate line, the at least one memory cell group being formed of unit cells connected in series, each of the unit cells being formed by connecting opposite ends of a ferroelectric capacitor to a source and a drain of a cell transistor;

a plurality of gate lines commonly connected to gates of corresponding ones of the cell transistors included in the memory cell blocks; and a plurality of branch lines formed of a layer different from a layer of the gate lines, arranged parallel to the gate lines, and each connected to a corresponding one of the gate lines, the branch lines having a predetermined width and being arranged at regular intervals, a sum of the predetermined width of the branch lines and an interval between each pair of adjacent ones of the branch lines differing from a sum of the predetermined width of the gate lines and an interval between each pair of adjacent ones of the gate lines.

28. The semiconductor memory device according to claim 27, wherein the sum of the predetermined width of the branch lines and the interval between said each pair of the adjacent ones of the branch lines is smaller than the sum of the predetermined width of the gate lines and the interval between said each pair of the adjacent ones of the gate lines.

* * * * *